(12) United States Patent
Ozawa et al.

(10) Patent No.: US 8,026,133 B2
(45) Date of Patent: Sep. 27, 2011

(54) METHOD OF FABRICATING A SEMICONDUCTOR DEVICE WITH A NON-UNIFORM GATE INSULATING FILM

(75) Inventors: Yoshio Ozawa, Yokohama (JP); Isao Kamioka, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/457,892

(22) Filed: Jun. 24, 2009

(65) Prior Publication Data

US 2009/0269894 A1    Oct. 29, 2009

Related U.S. Application Data

(62) Division of application No. 11/133,235, filed on May 20, 2005, now abandoned.

(30) Foreign Application Priority Data

Mar. 9, 2005    (JP) .................................. 2005-065812

(51) Int. Cl.
*H01L 29/78*    (2006.01)
*H01L 29/772*    (2006.01)

(52) U.S. Cl. ........ 438/197; 438/151; 438/184; 438/211; 438/300; 438/585; 257/282; 257/333; 257/395; 257/411; 257/E21.639

(58) Field of Classification Search .......... 257/204–205, 257/213, 262, 272, 274, 280, 282, 286, 288, 257/327, 333, 346–348, 368, 369, 387–389, 257/395, 396, 411, E21.675, E27.046, E27.059, 257/E27.06, E29.117, E29.122, E29.128, 257/E29.133; 438/149, 151, 167, 180, 184, 197, 211, 299, 300, 303, 585, 589

See application file for complete search history.

(56) References Cited

U.S. PATENT DOCUMENTS

| | | | |
|---|---|---|---|
| 4,477,962 A | 10/1984 | Godejahn, Jr. | |
| 5,051,794 A | 9/1991 | Mori | |
| 5,306,655 A | 4/1994 | Kurimoto | |
| 5,314,834 A | 5/1994 | Mazure et al. | |
| 5,434,813 A | 7/1995 | Tamura et al. | |
| 5,650,344 A * | 7/1997 | Ito et al. | 438/287 |
| 6,037,639 A * | 3/2000 | Ahmad | 257/401 |
| 6,069,041 A | 5/2000 | Tanigami et al. | |
| 6,215,163 B1 * | 4/2001 | Hori et al. | 257/411 |

(Continued)

OTHER PUBLICATIONS

Ozawa; "Nonvolatile Semiconductor Memory Cell and Method of Manufacturing the Same"; U.S. Appl. No. 10/791,870, filed Mar. 4, 2004, 44 pages.

*Primary Examiner* — Matthew Landau
*Assistant Examiner* — Maliheh Malek
(74) *Attorney, Agent, or Firm* — Finnegan, Henderson, Farabow, Garrett & Dunner, L.L.P.

(57) ABSTRACT

A semiconductor device includes a semiconductor substrate, a gate insulating film formed on the semiconductor substrate, a gate electrode formed on the gate insulating film, a source/drain diffusion layer formed in the semiconductor substrate at both sides of the gate electrode, and a channel region formed in the semiconductor substrate between a source and a drain of the source/drain diffusion layer and arranged below the gate insulating film, wherein an upper surface of the source/drain diffusion layer is positioned below a bottom surface of the gate electrode, and an upper surface of the channel region is positioned below the upper surface of the source/drain diffusion layer.

10 Claims, 11 Drawing Sheets

U.S. PATENT DOCUMENTS

| | | | |
|---|---|---|---|
| 6,228,717 B1* | 5/2001 | Hazama et al. | 438/265 |
| 6,281,558 B1 | 8/2001 | Sayama et al. | |
| 6,303,448 B1 | 10/2001 | Chang et al. | |
| 6,335,251 B2 | 1/2002 | Miyano et al. | |
| 6,429,496 B1* | 8/2002 | Li et al. | 257/411 |
| 6,498,374 B1* | 12/2002 | Ohuchi | 257/368 |
| 6,531,410 B2 | 3/2003 | Bertin et al. | |
| 6,599,821 B2* | 7/2003 | Lee | 438/592 |
| 6,642,105 B2 | 11/2003 | Kim et al. | |
| 6,707,120 B1* | 3/2004 | Aminzadeh et al. | 257/411 |
| 6,713,826 B2 | 3/2004 | Uehara et al. | |
| 6,797,556 B2 | 9/2004 | Murthy et al. | |
| 6,812,536 B2 | 11/2004 | Ueno et al. | |
| 7,439,602 B2 | 10/2008 | Kanamori | |
| 7,485,516 B2* | 2/2009 | Dyer et al. | 438/197 |
| 2001/0008293 A1* | 7/2001 | Shimizu et al. | 257/382 |
| 2001/0042894 A1 | 11/2001 | Brigham et al. | |
| 2002/0151129 A1* | 10/2002 | Yoshida et al. | 438/227 |
| 2003/0082861 A1 | 5/2003 | Mayuzumi | |
| 2003/0107041 A1 | 6/2003 | Tanimoto et al. | |
| 2004/0084731 A1 | 5/2004 | Matsuda et al. | |
| 2004/0207023 A1* | 10/2004 | Nishiyama et al. | 257/371 |
| 2004/0251495 A1* | 12/2004 | Ikuta et al. | 257/336 |
| 2005/0012172 A1 | 1/2005 | Kanamori | |
| 2005/0032322 A1 | 2/2005 | Kim et al. | |
| 2005/0079696 A1* | 4/2005 | Colombo | 438/595 |
| 2005/0085027 A1 | 4/2005 | Mimura et al. | |
| 2005/0106897 A1* | 5/2005 | Kang et al. | 438/786 |
| 2005/0233513 A1 | 10/2005 | Kim et al. | |
| 2006/0019436 A1* | 1/2006 | Lee | 438/197 |
| 2007/0215958 A1* | 9/2007 | Tanaka et al. | 257/411 |
| 2007/0218605 A1* | 9/2007 | Ozawa et al. | 438/164 |
| 2007/0218606 A1* | 9/2007 | Ozawa et al. | 438/165 |
| 2008/0224145 A1* | 9/2008 | Ohmi et al. | 257/66 |
| 2009/0035950 A1* | 2/2009 | Matsuyama et al. | 438/786 |

* cited by examiner $Cb < Ca < B < A$
$D \leqq A$

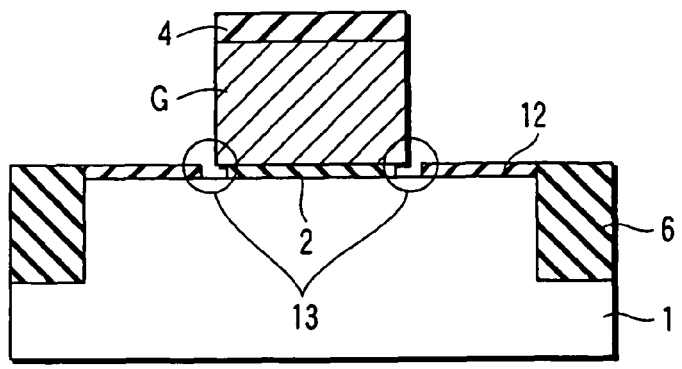
F I G. 10A
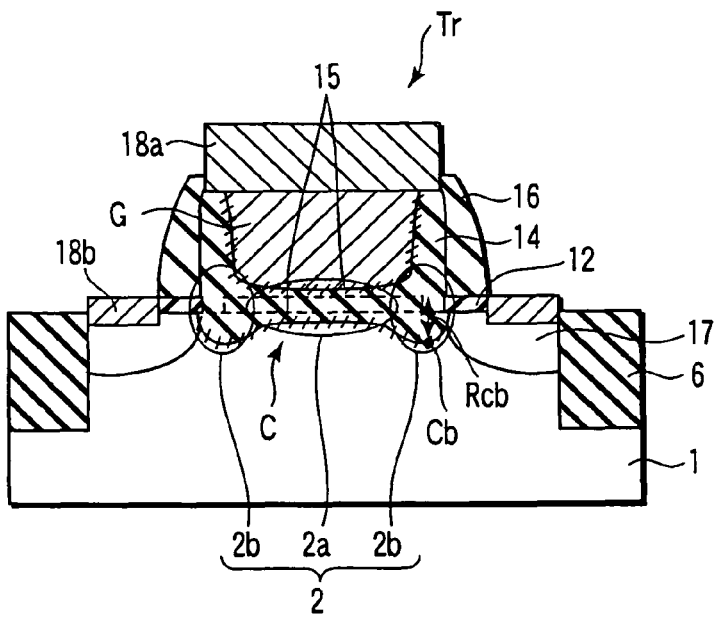
F I G. 10B
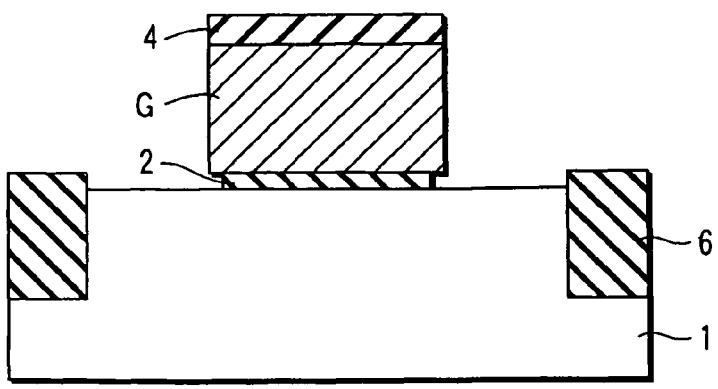
F I G. 11A

Cb<Ca<B<A
D≦A

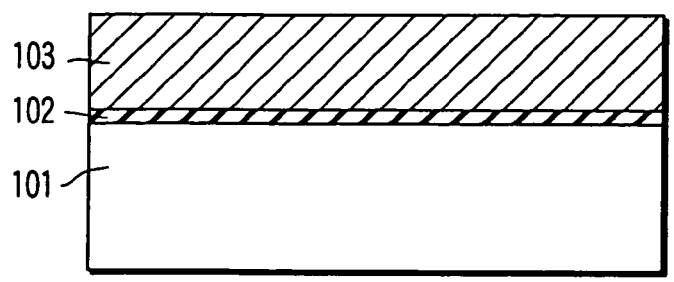 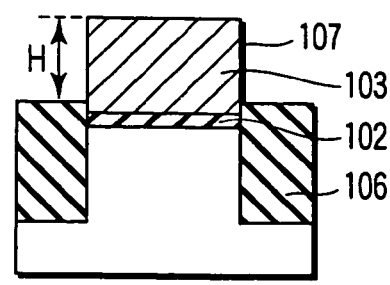
F I G. 17A  F I G. 17B
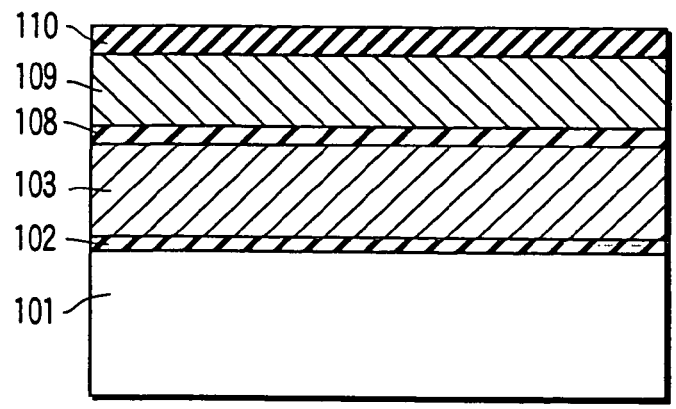 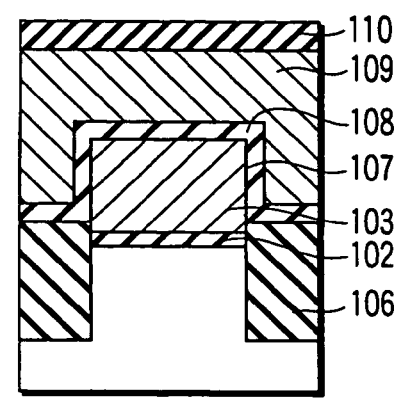
F I G. 18A  F I G. 18B
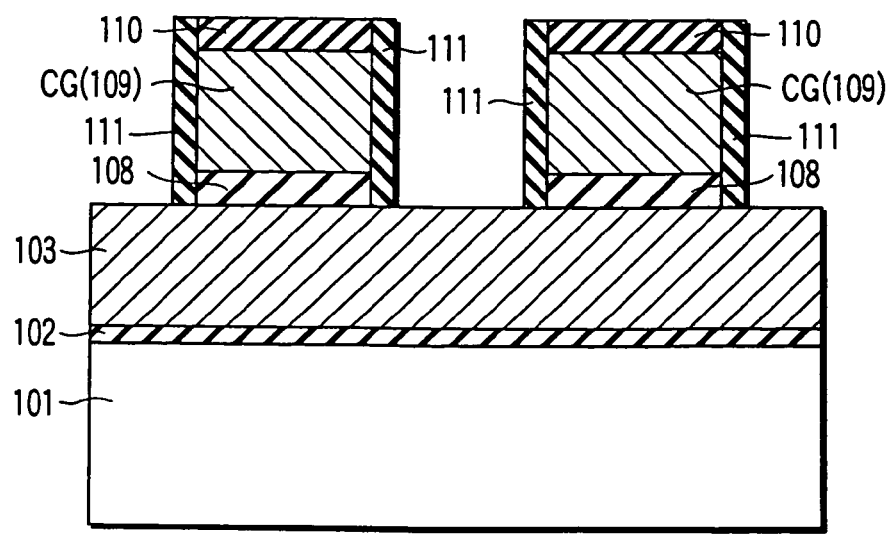
F I G. 19

METHOD OF FABRICATING A SEMICONDUCTOR DEVICE WITH A NON-UNIFORM GATE INSULATING FILM

CROSS-REFERENCE TO RELATED APPLICATIONS

This application is a divisional of application Ser. No. 11/133,235, filed May 20, 2005 now abandoned, and claims the benefit of priority from prior Japanese Patent Application No. 2005-065812, filed Mar. 9, 2005, the entire contents of both of which are incorporated herein by reference in their entirety.

BACKGROUND OF THE INVENTION

1. Field of the Invention

The present invention relates to a semiconductor device and a method of fabricating the same.

2. Description of the Related Art

As downsizing of transistor elements advances, a so-called short-channel effect becomes a problem. As a method of avoiding this short-channel effect, an elevated source/drain structure is conventionally known.

FIG. 26 is a schematic view showing a semiconductor device having an elevated source/drain structure according to prior art. As shown in FIG. 26, a gate electrode 3 is formed on a silicon substrate 1 via a gate oxide film 2, and a metal silicide layer 4 is formed on the gate electrode 3. A gate sidewall oxide film 14 and sidewall insulating film 16 are formed on the side surfaces of the gate electrode 3. The gate oxide film 2 is removed from the surface of the silicon substrate 1 outside the sidewall insulating film 16, and epitaxially grown silicon layers 20 are formed above the substrate surface position (indicated by the dotted lines in FIG. 26). An element serving as an impurity is ion-implanted into the silicon layers 20, and activation annealing is performed, thereby forming elevated source/drain diffusion layers 17.

In the above prior art, ion implantation is performed through the silicon layers 20 formed above the substrate surface position, so the source/drain diffusion layers 17 can be made shallow. Accordingly, this semiconductor device having the elevated source/drain structure can avoid the short-channel effect.

Unfortunately, this prior art has the problem that an overlap capacitance C between the gate electrode 3 and the source/drain diffusion layer 17 increases, and this decreases the operating speed of a transistor Tr. In addition, the number of fabrication steps increases, and this increases the device cost. Furthermore, a high-temperature step of epitaxial growth deteriorates the characteristics of the transistor Tr.

Note that prior art reference information related to the invention of this application is, e.g., U.S. Pat. No. 6,335,251.

BRIEF SUMMARY OF THE INVENTION

A semiconductor device according to a first aspect of the present invention comprises a semiconductor substrate, a gate insulating film formed on the semiconductor substrate, a gate electrode formed on the gate insulating film, a source/drain diffusion layer formed in the semiconductor substrate at both sides of the gate electrode, and a channel region formed in the semiconductor substrate between a source and a drain of the source/drain diffusion layer and arranged below the gate insulating film, wherein an upper surface of the source/drain diffusion layer is positioned below a bottom surface of the gate electrode, and an upper surface of the channel region is positioned below the upper surface of the source/drain diffusion layer.

A semiconductor device manufacturing method according to a second aspect of the present invention comprises forming a gate insulating film on a semiconductor substrate, selectively forming a gate electrode on the gate insulating film, forming a nitrogen-containing insulating film by nitriding an exposed portion of the gate insulating film, performing thermal oxidation that an oxide amount at an upper surface of the semiconductor substrate and at a bottom surface of the gate electrode reduces from an end portion to a central portion of a channel region beneath the gate electrode, forming a sidewall layer on a side surface of the gate electrode, and thickening the gate insulating film in a lower end portion of the gate electrode, and forming a source/drain diffusion layer in the semiconductor substrate.

BRIEF DESCRIPTION OF THE SEVERAL VIEWS OF THE DRAWING

FIGS. 10A and 10B are sectional views showing the fabrication steps of another semiconductor device according to the first embodiment of the present invention, in which after silicon oxynitride layers are formed, a gate oxide film in gaps is removed;

FIGS. 11A and 11B are sectional views showing the fabrication steps of still another semiconductor device according to the first embodiment of the present invention, in which after a gate electrode is formed, a gate oxide film exposed from the gate electrode is removed;

FIGS. 15A to 22 are sectional views showing the fabrication steps of a nonvolatile semiconductor memory according to the second embodiment of the present invention, in which FIGS. 15A, 16A, 17A, 18A, and 19 to 22 are sectional views in a bit line direction (channel length direction), and FIGS. 15B, 16B, 17B, and 18B are sectional views in a word line direction (channel width direction);

DETAILED DESCRIPTION OF THE INVENTION

Figure 1:
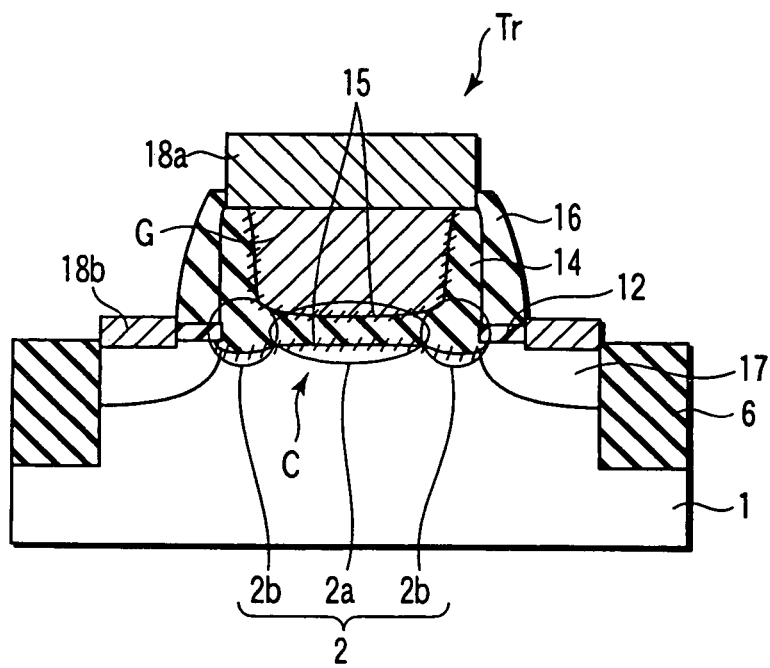
FIG. 1 is a sectional view showing a semiconductor device according to the first embodiment of the present invention.

Embodiments of the present invention will be described below with reference to the accompanying drawing. In the following description, the same reference numerals denote the same parts throughout the drawing.

First Embodiment

Figure 2:
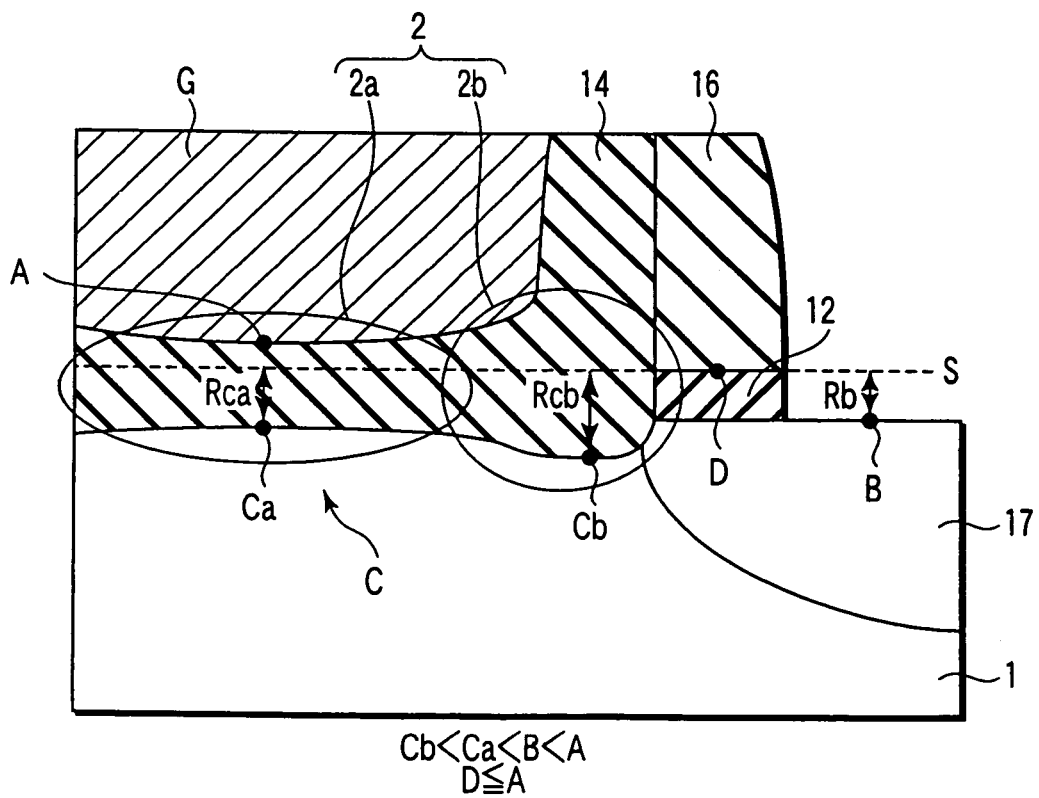
FIG. 2 is a partially enlarged schematic view of the semiconductor device shown in FIG. 1.

FIG. 1 is a sectional view of a semiconductor device according to the first embodiment of the present invention. FIG. 2 is a partially enlarged schematic view of the semiconductor device shown in FIG. 1. This semiconductor device according to the first embodiment will be explained below.

As shown in FIG. 1, a gate electrode G is formed on a silicon substrate (semiconductor substrate) 1 via a gate oxide film 2, and a channel region C is formed in the silicon substrate 1 below the gate electrode G. A gate sidewall oxide film 14 is formed on the side surfaces of the gate electrode G. A sidewall insulating film 16 is formed on the side surfaces of the gate sidewall oxide film 14. Source/drain diffusion layers 17 are formed in the silicon substrate 1 so as to sandwich the gate electrode G between them. An element isolation insulating film 6 having an STI (Shallow Trench Isolation) structure is formed adjacent to the source/drain diffusion layers 17. Silicon oxynitride layers (nitrogen-containing insulating films) 12 are formed on portions of the source/drain diffusion layers 17. The silicon oxynitride layers 12 are positioned below the sidewall insulating film 16. A metal silicide layer 18a is formed on the upper surface of the gate electrode G, and metal silicide layers 18b are formed on the source/drain diffusion layers 17. In addition, interface nitride layers 15 are formed in the interface between the gate electrode G and gate oxide film 2, in the interface between the gate electrode G and gate sidewall oxide film 14, and in the interface between the gate oxide film 2 and silicon substrate 1.

The gate oxide film 2 has a central portion 2a positioned below the gate electrode G, and end portions 2b positioned below the gate sidewall oxide film 14. The film thickness of the end portions 2b of the gate oxide film 2 is larger than that of the central portion 2a of the gate oxide film 2, so the film thickness of the gate oxide film 2 gradually increases from the central portion 2a toward the end portions 2b. Also, the boundary between the gate oxide film 2 and gate sidewall oxide film 14 is unclear; the gate oxide film 2 and gate sidewall oxide film 14 are substantially integrated when formed by thermal oxidation.

The film thickness of the gate sidewall oxide film 14 decreases from the bottom surface to the upper surface of the gate electrode G. In other words, the gate length (the width in the lateral direction of the paper) of the gate electrode G increases from the bottom surface to the upper surface.

As shown in FIG. 2, a position B of the upper surface of the source/drain diffusion layer 17 is lower than a position A of the bottom surface (the upper surface of the central portion 2a of the gate oxide film 2) of the gate electrode G. Also, positions Ca and Cb of the upper surface (the bottom surfaces of the central portion 2a and end portion 2b of the gate oxide film 2) of the channel region C are lower than the position B of the upper surface of the source/drain diffusion layer 17. Furthermore, the position Cb of the upper surface (the bottom surface of the end portion 2b of the gate oxide film 2) of the channel region C in the end portion 2b of the gate oxide film 2 is lower than the position Ca of the upper surface (the bottom surface of the central portion 2a of the gate oxide film 2) of the channel region C in the central portion 2a of the gate oxide film 2.

In other words, recession amounts Rca and Rcb from a position S of the upper surface of the silicon substrate 1 to the positions Ca and Cb, respectively, of the upper surface of the channel region C are larger than a recession amount Rb from the position S of the upper surface of the silicon substrate 1 to the position B of the upper surface of the source/drain diffusion layer 17. In addition, the recession amount Rcb from the position S of the upper surface of the silicon substrate 1 to the position Cb of the upper surface of the channel region C in the end portion 2b of the gate oxide film 2 is larger than the recession amount Rca from the position S of the upper surface of the silicon substrate 1 to the position Ca of the upper surface of the channel region C in the central portion 2a of the gate oxide film 2.

Also, a position D of the upper surface of the silicon oxynitride layer 12 is equal to or lower than the position A of the bottom surface of the gate electrode G.

Note that the source/drain diffusion layer 17 can take various shapes. For example, a so-called extension diffusion layer (or shallow junction region) or the like may also be formed. Also, to suppress the short-channel effect, the dopant impurity concentration at the substrate surface is desirably maximized.

FIGS. 3 to 8 are sectional views showing the fabrication steps of the semiconductor device according to the first embodiment of the present invention. The fabrication method of the semiconductor device according to the first embodiment will be explained below.

Figure 3:
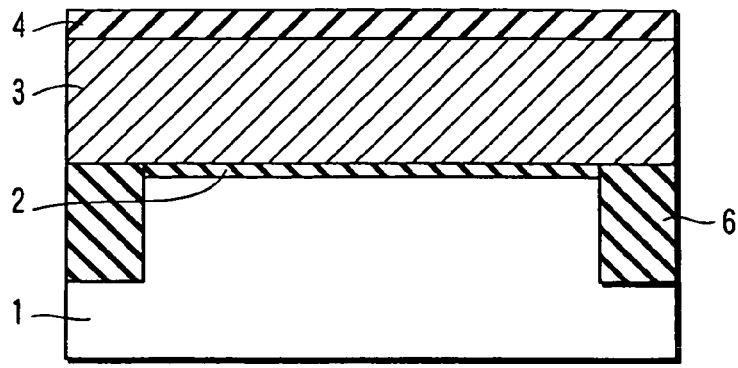
FIGS. 3 to 8 are sectional views showing the fabrication steps of the semiconductor device according to the first embodiment of the present invention.

First, as shown in FIG. 3, a gate oxide film 2 having a thickness of, e.g., 5 nm is formed by thermal oxidation on the surface of a silicon substrate 1 in which a desired impurity is doped. Then, an element isolation insulating film 6 serving as element isolation regions is formed in the silicon substrate 1. An example of the material of the element isolation insulating film 6 is a silicon oxide film. After that, a polysilicon layer 3 serving as a gate electrode G and a mask material 4 are sequentially deposited by CVD (Chemical Vapor Deposition). An example of the mask material 4 is a silicon nitride film.

Figure 4:
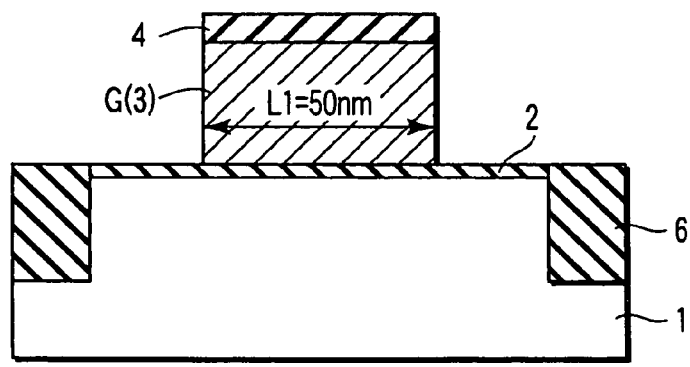

As shown in FIG. 4, a gate electrode G is formed by processing the mask material 4 and polysilicon layer 3 by RIE (Reactive Ion Etching). In this state, a gate length (channel length) L1 is, e.g., about 50 nm.

Figure 5:
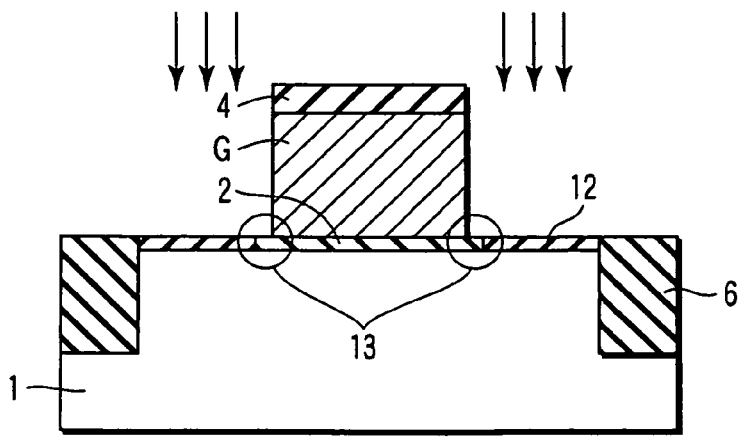

As shown in FIG. 5, active nitrogen ions (indicated by arrows in FIG. 5) are incident to nitride exposed portions of the gate oxide film 2. This nitriding is so performed that in a region between the gate electrode G and element isolation insulating film 6, the nitrogen concentration is maximized in the boundary to the element isolation insulating film 6 and minimized in the boundary to the gate electrode G. Consequently, on the silicon substrate 1 between the gate electrode G and element isolation insulating film 6, silicon oxynitride layers 12 in which the nitrogen concentration is higher than the oxygen concentration are formed. Gaps 13 are formed between one end of each silicon oxynitride layer 12 and the end portion of the gate electrode G (one end of each silicon oxynitride layer 12 is not in contact with the end portion of the gate electrode G), and the other end of the silicon oxynitride layer 12 is in contact with the element isolation insulating film 6. Note that nitriding by active nitrogen ions may also be nitriding by charged radical nitrogen performed by also by using a radical nitriding process, or nitrogen ions may also be drawn by applying a bias to the substrate.

In this embodiment, the gaps 13 are formed because they are hidden by the gate electrode G. However, the gaps 13 need not be formed if the nitrogen concentration is low in the boundaries between the gate electrode G and silicon oxynitride layers 12.

Figure 6:
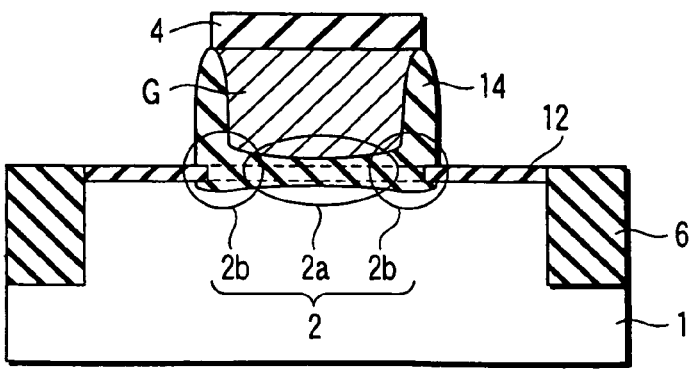

As shown in FIG. 6, a gate sidewall oxide film 14 having a thickness of, e.g., 10 nm is formed on the sidewalls of the gate electrode G. In this case, the surface portion of the silicon substrate 1 and the bottom portion of the gate electrode G are so oxidized that the oxide amount in the silicon substrate 1 reduces from the end portions to the central portion of the channel region. Since the silicon oxynitride layers 12 on the surface of the silicon substrate 1 function as anti-oxidation layers, the oxidation reaction does not progress in these portions, so bird's beak oxidation of the channel region advances. Consequently, the thickness of the gate oxide film 2 at the lower end portions of the gate electrode G increases, so the film thickness of end portions 2b of the gate oxide film 2 becomes lager than that of a central portion 2a of the gate oxide film 2. For example, the film thickness of the end portions 2b of the gate oxide film 2 is as large as about 10 nm, and that of the central portion 2a of the gate oxide film 2 is about 6 nm.

Figure 7:
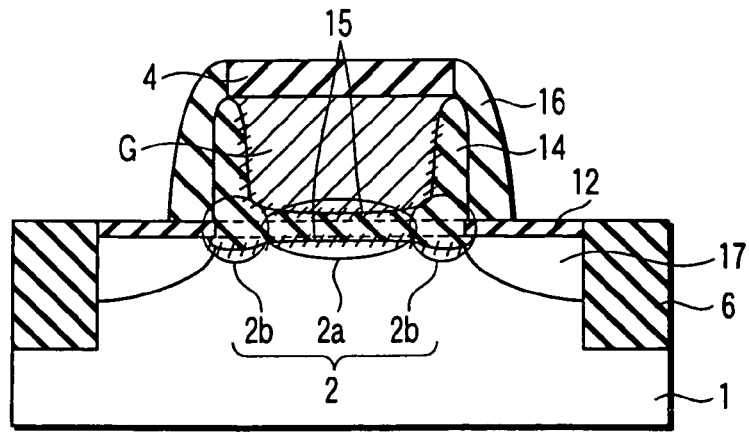

As shown in FIG. 7, oxynitriding is performed in an NO gas or $N_2O$ gas ambient at 900° C. to form interface nitride layers 15 in the interface between the gate electrode G and gate oxide film 2, in the interface between the gate electrode G and gate sidewall oxide film 14, and in the interface between the gate oxide film 2 and silicon substrate 1. A sidewall insulating film 16 is formed on the side surfaces of the gate electrode G by using a known technique. Note that the interface nitride layers 15 may also be formed after the sidewall insulating film 16 is formed. After that, source/drain diffusion layers 17 are formed in the silicon substrate 1 below the silicon oxynitride layers 12.

Figure 8:
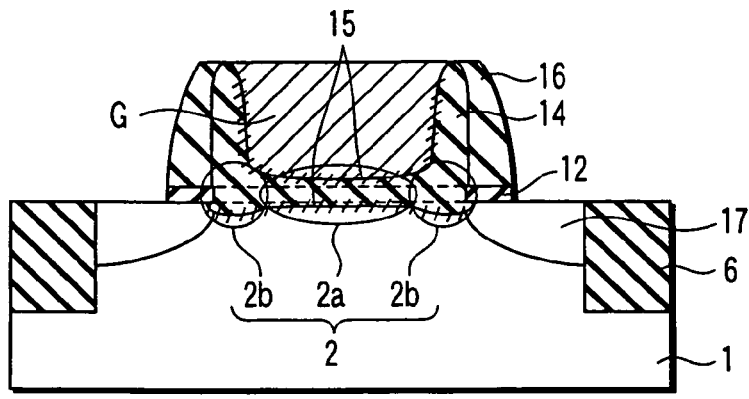

As shown in FIG. 8, the mask material 4 is selectively removed. As a consequence, the silicon oxynitride layers 12 exposed from the sidewall insulating film 16 are also removed to expose the upper surfaces of the source/drain diffusion layers 17.

Then, as shown in FIG. 1, the upper surfaces of the gate electrode G and source/drain diffusion layers 17 are silicided to form metal silicide layers 18a and 18b. Examples of the metal silicide layers 18a and 18b are cobalt silicide, tungsten silicide, and titanium silicide. In this manner, a semiconductor device having a transistor Tr is completed.

Figure 9:
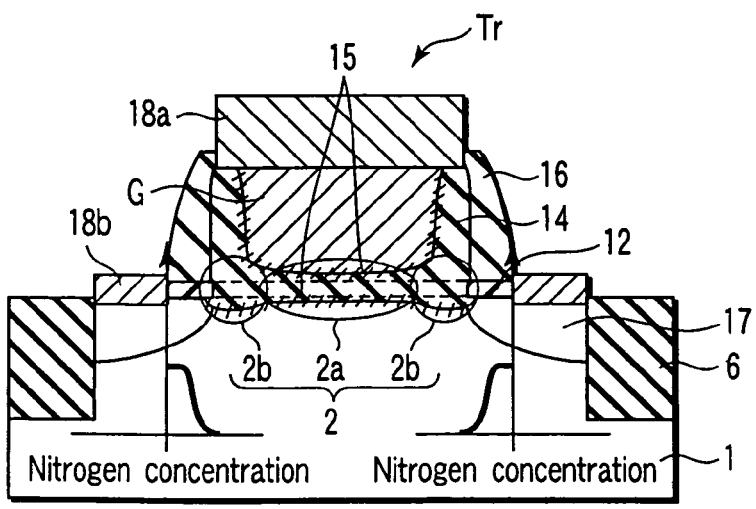
FIG. 9 is a view showing the nitrogen concentration distribution in silicon oxynitride layers according to the first embodiment of the present invention.

FIG. 9 shows the nitrogen concentration distribution in the silicon oxynitride layers according to the first embodiment of the present invention. This nitrogen concentration distribution in the silicon oxynitride layers according to the first embodiment will be explained below.

As shown in FIG. 9, the nitrogen concentration in each silicon oxynitride layer 12 gradually increases from a first end portion adjacent to the gate electrode G to a second end portion opposite to the first end portion. Accordingly, in the silicon oxynitride layer 12, the nitrogen concentration is lowest in the first end portion and highest in the second end portion.

In the first embodiment described above, the position B of the upper surface of the source/drain diffusion layers 17 is lower than the position A of the bottom surface of the gate electrode G, and the positions Ca and Cb of the upper surface of the channel region C are lower than the position B of the upper surface of the source/drain diffusion layers 17 (FIG. 2). That is, the position of the upper surface of the channel region C can be made lower than that in the conventional devices. In particular, depletion layers of the source/drain diffusion layers 17 can be separated between the source and drain by the end portions 2b of the gate oxide film 2. It is also possible to effectively substantially increase the channel length (source-to-drain distance). Therefore, punch through can be suppressed even when the channel length increases. This makes it possible to suppress the short-channel effect and downsize the transistor Tr.

In addition, the film thickness of the central portion 2a of the gate oxide film 2 is smaller than that of the end portions 2b. This increases the gate potential's control over the channel potential, so the short-channel effect can be suppressed more effectively.

Furthermore, the film thickness of the end portions 2b of the gate oxide film 2 positioned in the end portions of the gate electrode G is large. This makes it possible to reduce the parasitic capacitance between the gate electrode G and source/drain diffusion layers 17, so the decrease in operating speed of the transistor can be further suppressed. Also, since the electric fields between the end portions of the gate electrode G and the source/drain diffusion layers 17 can be reduced, changes in transistor characteristics with operation time can be suppressed. Accordingly, the reliability of the transistor Tr can be improved.

Since the film thickness of the end portions 2b of the gate oxide film 2 is large, the distance between the gate electrode G and the source/drain diffusion layer 17 can be increased. In this case, compared to the conventional elevated source/drain structure, the overlap capacitance C between the gate electrode G and source/drain-diffusion layer 17 can be reduced. This eliminates the problem of the decrease in operating speed of the transistor Tr.

The gate length (channel length) L1 is approximately 50 nm or less. With this prescribed value, the central portion 2a (channel central portion) of the gate oxide film 2 can be well oxidized in the channel portion thermal oxidation step shown in FIG. 6.

Also, the interface nitride layers 15 are formed in the interface between the gate electrode G and gate oxide film 2, in the interface between the gate electrode G and gate sidewall oxide film 14, and in the interface between the gate oxide film 2 and silicon substrate 1. Therefore, it is possible to prevent mixing of an impurity from the gate electrode G or silicon substrate 1 to the gate oxide film 2.

Note that in the first embodiment, after the silicon oxynitride layers 12 are formed (FIG. 5), it is also possible to remove the gate oxide film 2 in the gaps 13 (or low-nitrogen-concentration regions in the boundaries to the gate electrode G) by, e.g., a dilute hydrofluoric acid solution (FIG. 10A), and then form a gate sidewall oxide film 14 by thermal oxidation. In this case, as shown in FIG. 10B, oxidation readily progresses near the gaps 13, so the film thickness of the end portions 2b of the gate oxide film 2 can be further increased. Accordingly, the position Cb of the upper surface of the end portion of the channel region C lowers, so the recession amount Rcb can be further increased. This makes it possible to suppress the short-channel effect more effectively.

Figure 11B:
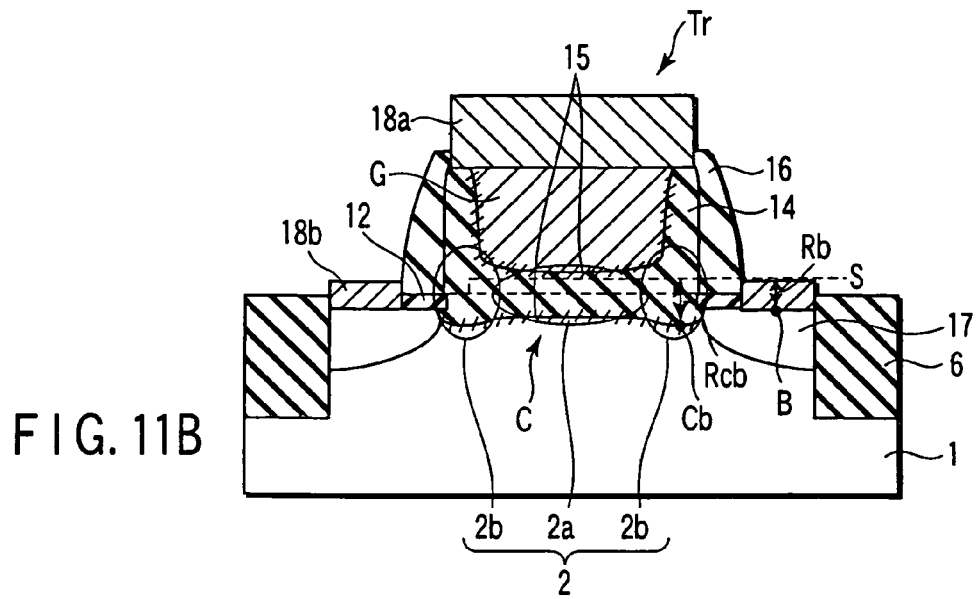

Likewise, after the gate electrode G is formed (FIG. 4), it is also possible to remove the gate oxide film 2 exposed from the gate electrode G by, e.g., a dilute hydrofluoric acid solution (FIG. 11A), and then form silicon oxynitride layers 12. In this structure as shown in FIG. 11B, compared to the structure shown in FIG. 1, the position B of the upper surfaces of the source/drain layers 17 decreases, and the recession amount Rb increases, but the position Cb of the upper surfaces of the end portions of the cannel region C also decreases, and the recession amount Rcb also increases. Therefore, the short-channel effect can be suppressed as in the structure shown in FIG. 1. In addition, it is possible to form silicon oxynitride layers 12 having an oxidation proof property higher than that of the structure shown in FIG. 1.

Figure 12:
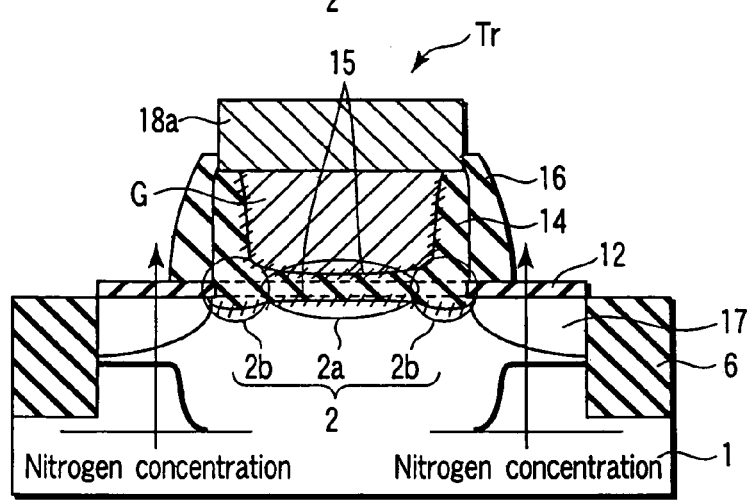
FIG. 12 is a sectional view showing the fabrication steps of still another semiconductor device according to the first embodiment of the present invention, in which in a mask material removing step, exposed portions of silicon oxynitride layers are not removed.

Furthermore, the exposed portions of the silicon oxynitride layers 12 may also be kept unremoved in the step of removing the mask material 4 shown in FIG. 8, by forming the mask material 4 by using a material (e.g., a silicon oxide film) having high selectivity to the silicon oxynitride layers 12. In this case, as shown in FIG. 12, the silicon oxynitride layers 12 remain on the upper surfaces of the source/drain diffusion layers 17, so the metal silicide layers 18b shown in FIG. 1 are not formed. In this structure, between the gate electrode G and element isolation insulating film 6, the nitrogen concentration is maximized in the boundary between the silicon oxynitride layer 12 and element isolation insulating film 6, and minimized in the boundary between the silicon oxynitride layer 12 and gate electrode G.

Second Embodiment

The second embodiment shows an example of a nonvolatile semiconductor memory including a memory cell transistor having a floating gate electrode and control gate electrode.

Figure 13:
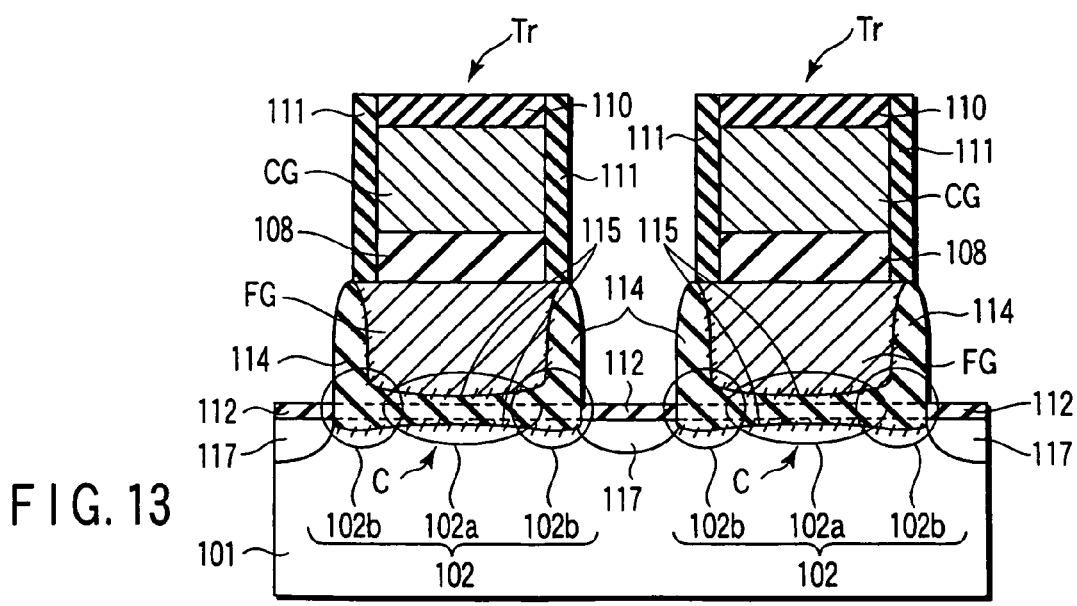
FIG. 13 is a sectional view showing a semiconductor device according to the second embodiment of the present invention.
Figure 14:
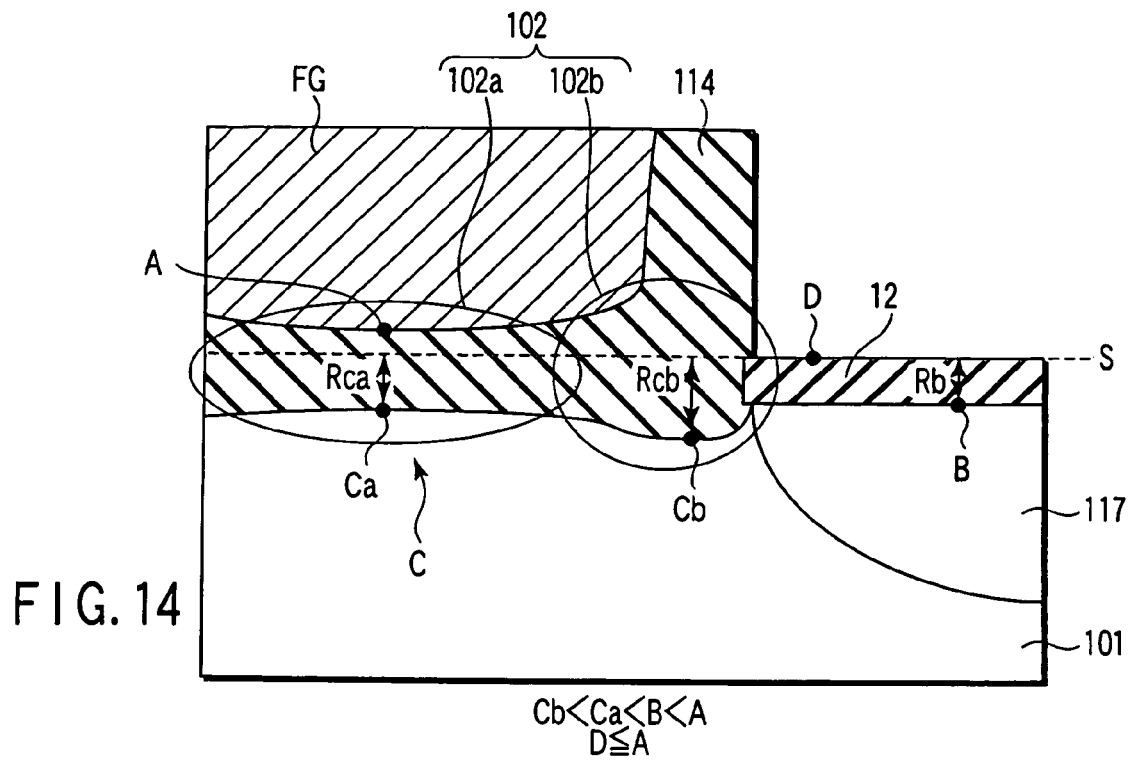
FIG. 14 is a partially enlarged schematic view of the semiconductor device shown in FIG. 13.

FIG. 13 is a sectional view of the nonvolatile semiconductor memory according to the second embodiment of the present invention. FIG. 14 is a partially enlarged schematic view of the nonvolatile semiconductor memory shown in FIG. 13. This nonvolatile semiconductor memory according to the second embodiment will be described below.

As shown in FIG. 13, the second embodiment differs from the first embodiment in that a memory cell transistor Tr of a nonvolatile semiconductor memory is taken as an example. Therefore, the structure of the second embodiment is as follows.

A floating gate electrode FG is formed on a silicon substrate 101 via a tunnel oxide film 102, and a control gate electrode CG is formed on the floating gate electrode FG via an inter-electrode insulating film 108. A silicon nitride film 110 is formed on the control gate electrode CG. A sidewall cover film 111 is formed on the side surfaces of the silicon nitride film 110, control gate electrode CG, and inter-electrode insulating film 108. A gate sidewall oxide film 114 is formed on the side surfaces of the floating gate electrode FG. A channel region C is formed in the silicon substrate 101 below the floating gate electrode FG. Silicon oxynitride layers 112 are formed on inter-cell regions of the silicon substrate 101. Source/drain diffusion layers 117 are formed in the silicon substrate 101 below the silicon oxynitride layers 112. In addition, interface nitride layers 115 are formed in the interface between the floating gate electrode FG and tunnel oxide film 102, in the interface between the floating gate electrode FG and gate sidewall oxide film 114, and in the interface between the tunnel oxide film 102 and silicon substrate 101.

The tunnel oxide film 102 has a central portion 102a positioned below the floating gate electrode FG, and end portions 102b positioned below the gate sidewall oxide film 114. The film thickness of the end portions 102b of the tunnel oxide film 102 is larger than that of the central portion 102a of the tunnel oxide film 102, so the film thickness of the tunnel oxide film 102 gradually increases from the central portion 102a toward the end portions 102b. Also, the boundary between the tunnel oxide film 102 and gate sidewall oxide film 114 is unclear; the tunnel oxide film 102 and gate sidewall oxide film 114 are substantially integrated when formed by thermal oxidation.

The film thickness of the gate sidewall oxide film 114 decreases from the bottom surface to the upper surface of the floating gate electrode FG. In other words, the gate length (the width in the lateral direction of the paper) of the floating gate electrode FG increases from the bottom surface to the upper surface.

As shown in FIG. 14, a position B of the upper surface of the source/drain diffusion layer 117 is lower than a position A of the bottom surface (the upper surface of the central portion 102a of the tunnel oxide film 102) of the floating gate electrode FG. Also, positions Ca and Cb of the upper surface (the bottom surfaces of the central portion 102a and end portion 102b of the tunnel oxide film 102) of the channel region C are lower than the position B of the upper surface of the source/drain diffusion layer 117. Furthermore, the position Cb of the upper surface (the bottom surface of the end portion 102b of the tunnel oxide film 102) of the channel region C in the end portion 102b of the tunnel oxide film 102 is lower than the position Ca of the upper surface (the bottom surface of the central portion 102a of the tunnel oxide film 102) of the channel region C in the central portion 102a of the tunnel oxide film 102.

In other words, recession amounts Rca and Rcb from a position S of the upper surface of the silicon substrate 101 to the positions Ca and Cb, respectively, of the upper surface of the channel region C are larger than a recession amount Rb from the position S of the upper surface of the silicon substrate 101 to the position B of the upper surface of the source/drain diffusion layer 117. In addition, the recession amount Rcb from the position S of the upper surface of the silicon substrate 101 to the position Cb of the upper surface of the channel region C in the end portion 102b of the tunnel oxide film 102 is larger than the recession amount Rca from the position S of the upper surface of the silicon substrate 101 to the position Ca of the upper surface of the channel region C in the central portion 102a of the tunnel oxide film 102.

Also, a position D of the upper surface of the silicon oxynitride layer 112 is equal to or lower than the position A of the bottom surface of the floating gate electrode FG.

FIGS. 15A to 22 are sectional views showing the fabrication steps of the nonvolatile semiconductor memory according to the second embodiment of the present invention. FIGS. 15A, 16A, 17A, 18A, and 19 to 22 are sectional views in a bit line direction (channel length direction). FIGS. 15B, 16B, 17B, and 18B are sectional views in a word line direction (channel width direction). The fabrication method of the nonvolatile semiconductor memory according to the second embodiment will be explained below.

Figure 15A:
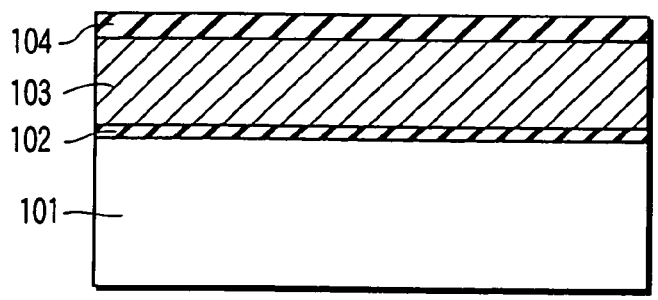
Figure 15B:
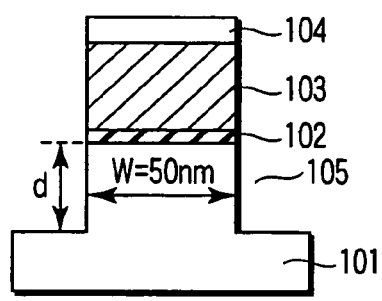

First, as shown in FIGS. 15A and 15B, a tunnel oxide film 102 having a thickness of, e.g., 5 nm is formed by thermal oxidation on the surface of a silicon substrate 101 in which a desired impurity is doped. Then, a phosphorus-doped polysilicon layer 103 serving as floating gate electrodes FG and having a thickness of, e.g., 100 nm and a mask material 104 for element isolation processing are sequentially deposited by CVD (Chemical Vapor Deposition). After that, RIE using a resist mask (not shown) is performed to sequentially etch the mask material 104, polysilicon layer 103, and tunnel oxide film 102, and etch the exposed regions of the silicon substrate 101. As a consequence, element isolation trenches 105 having a depth d of, e.g., 100 nm are formed. A channel width W is, e.g., about 50 nm.

Figure 16A:
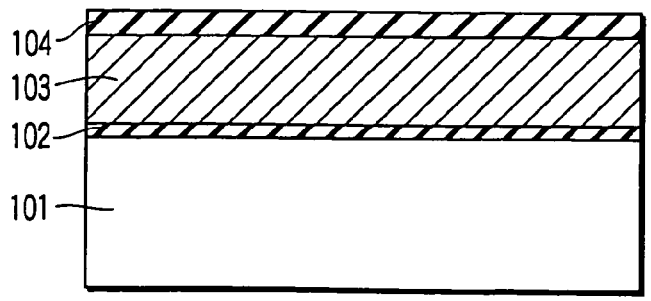
Figure 16B:
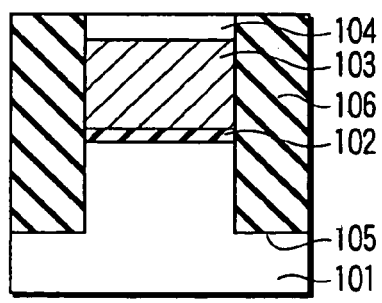

As shown in FIGS. 16A and 16B, an element isolation insulating film 106 made of, e.g., a silicon oxide film is deposited on the silicon substrate 101 and mask material 104, and embedded in the element isolation trenches 105. After that, CMP (Chemical Mechanical Polishing) is performed to planarize the upper surface of the element isolation insulating film 106 until the mask material 104 is exposed.

As shown in FIGS. 17A and 17B, the mask material 104 is selectively etched away. Then, a dilute hydrofluoric acid solution is used to etch away the upper portion of the element isolation insulating film 106 until its upper surface is positioned below the upper surface of the polysilicon layer 103. In this manner, sidewall surfaces 107 of the polysilicon layer 103 are exposed. A height H of the sidewall surfaces 107 is, e.g., 50 nm.

As shown in FIGS. 18A and 18B, an inter-electrode insulating film 108 having a film thickness of, e.g., 15 nm is deposited on the polysilicon layer 103 and element isolation insulating film 106 by CVD. The inter-electrode insulating film 108 is an ONO (Oxide Nitride Oxide) film having a three-layered structure including, e.g., a silicon oxide film/silicon nitride film/silicon oxide film each having a film thickness of, e.g., 5 nm. After that, a conductive layer 109 serving as control gate electrodes CG and having a thickness of, e.g., 100 nm is deposited on the inter-electrode insulating film 108. The conductive layer 109 has a two-layered structure including a polysilicon layer/tungsten silicide layer. Furthermore, a silicon nitride film 110 serving as a mask material in RIE is deposited on the conductive layer 109 by CVD.

Then, as shown in FIG. 19, the silicon nitride film 110, conductive layer 109, and inter-electrode insulating film 108 are sequentially etched by RIE using a resist mask (not shown). In this way, control gate electrodes CG made of the conductive layer 109 are patterned. After that, a sidewall cover film 111 having a thickness of, e.g., 5 nm is formed on the side surfaces of the silicon nitride film 110, control gate electrodes CG, and inter-electrode insulating film 108 by low-pressure CVD. Note that in this embodiment, a silicon nitride film is formed as the sidewall cover film 111 by using low-pressure CVD. However, it is also possible to form a nitride layer by using plasma nitriding, or to perform oxynitriding by using an oxynitriding gas such as NO or $N_2O$ gas.

Figure 20:
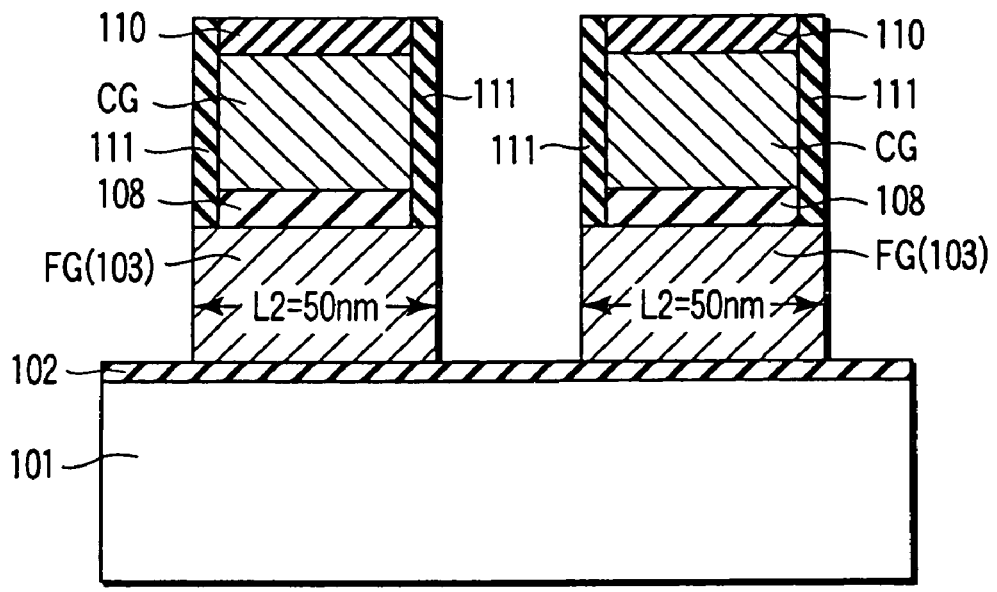

As shown in FIG. 20, the polysilicon layer 103 is processed by RIE, thereby patterning floating gate electrodes FG made of the polysilicon layer 103. A channel length L2 is, e.g., about 50 nm.

Figure 21:
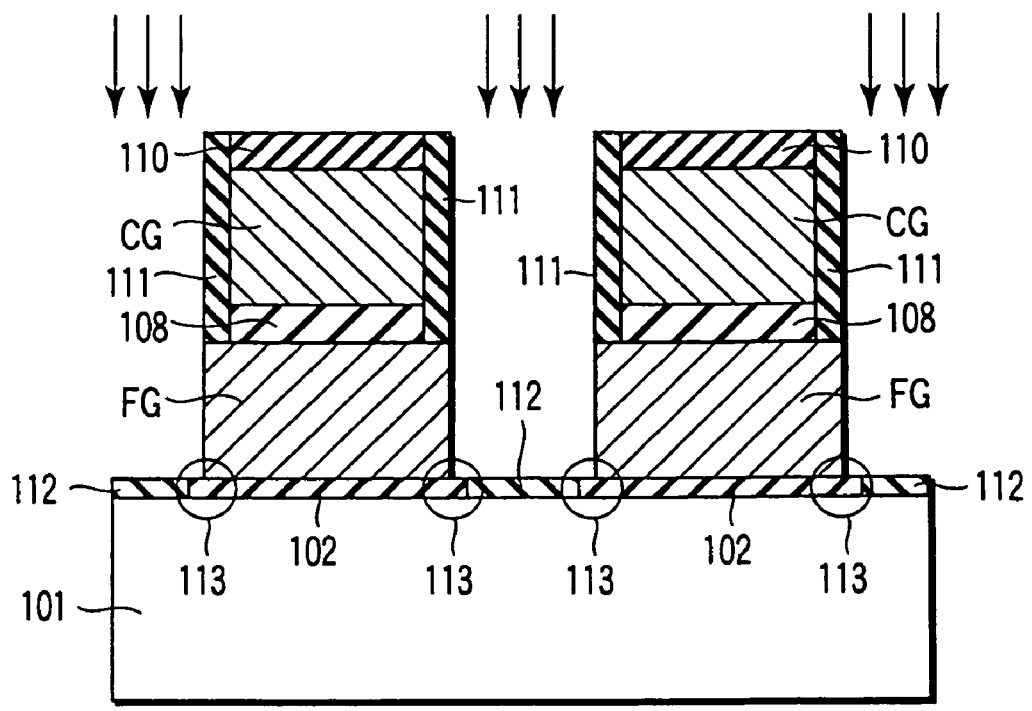

As shown in FIG. 21, active nitrogen ions (indicated by arrows in FIG. 21) are incident from openings between adjacent cells to nitride portions of the tunnel oxide film 102. This nitriding is so performed that the nitrogen concentration is maximized in the central portions of the inter-cell regions, and minimized in their end portions. Consequently, on the silicon substrate 101 in the central portions of the inter-cell regions, silicon oxynitride layers 112 in which the nitrogen concentration is higher than the oxygen concentration are formed. Gaps 113 are desirably formed between the silicon oxynitride layers 112 and floating gate electrodes FG so that the silicon oxynitride layers 112 are not in contact with the floating gate electrodes FG. Note that if the nitrogen concentration is low, the silicon oxynitride layers 112 can be in contact with the floating gate electrodes FG. Note also that nitriding by active nitrogen ions may also be nitriding by charged radical nitrogen performed by using a radical nitriding process, or nitrogen ions may also be drawn by applying a bias to the substrate.

Figure 22:
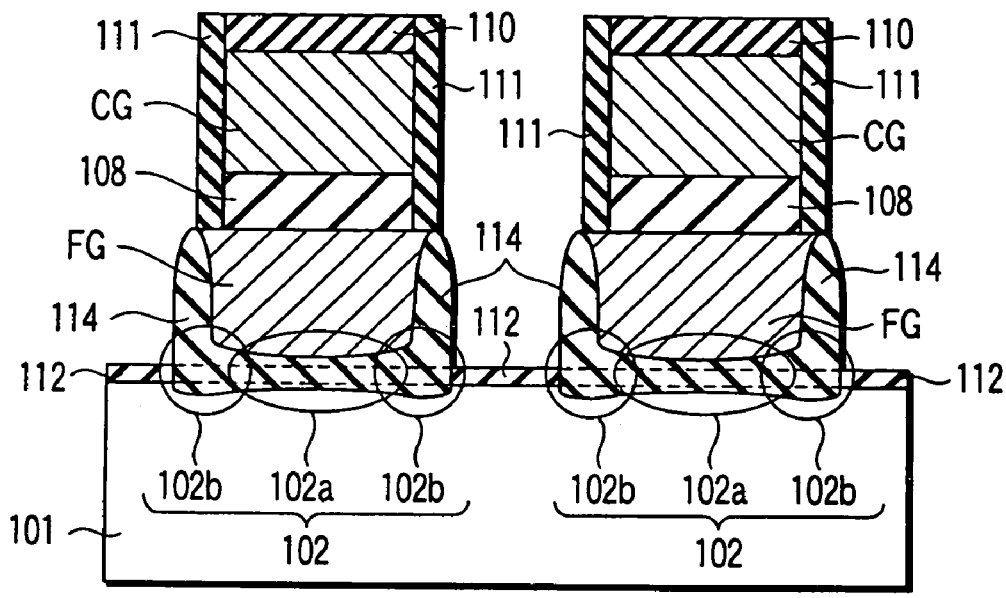

As shown in FIG. 22, a gate sidewall oxide film 114 having a thickness of, e.g., 10 nm is formed on the side surfaces of each floating gate electrode FG. In this case, the surface portion of the silicon substrate 101 and the bottom portion of the floating gate electrode FG are so oxidized that the oxide amount in the silicon substrate 101 reduces from the end portions to the central portion of each channel region. Since the silicon oxynitride layers 112 on the substrate surface between the cells function as anti-oxidation layers, the oxidation reaction does not progress in the inter-cell regions, so bird's beak oxidation of the channel regions advances. Consequently, the film thickness of end portions 102b of the tunnel oxide film 102 becomes larger than that of a central portion 102a of the tunnel oxide film 102. That is, the film thickness of the end portions 102b of the tunnel oxide film 102 is as large as about 10 nm, and that of the central portion 102a of the tunnel oxide film 102 is about 6 nm. Note that no bird's beak oxidation occurs on the side surfaces of the inter-electrode insulating film 108 because they are covered with the sidewall cover film 111.

Then, as shown in FIG. 13, oxynitriding is performed in an NO gas or $N_2O$ gas ambient at 900° C. to form interface nitride layers 115 in the interface between the floating gate electrode FG and tunnel oxide film 102, in the interface between the floating gate electrode FG and gate sidewall oxide film 114, and in the interface between the gate oxide film 102 and silicon substrate 101. After that, source/drain diffusion layers 117 are formed in the silicon substrate 101 below the silicon oxynitride layers 112 by using a known technique. In this manner, nonvolatile memory transistors Tr are completed.

Figure 23:
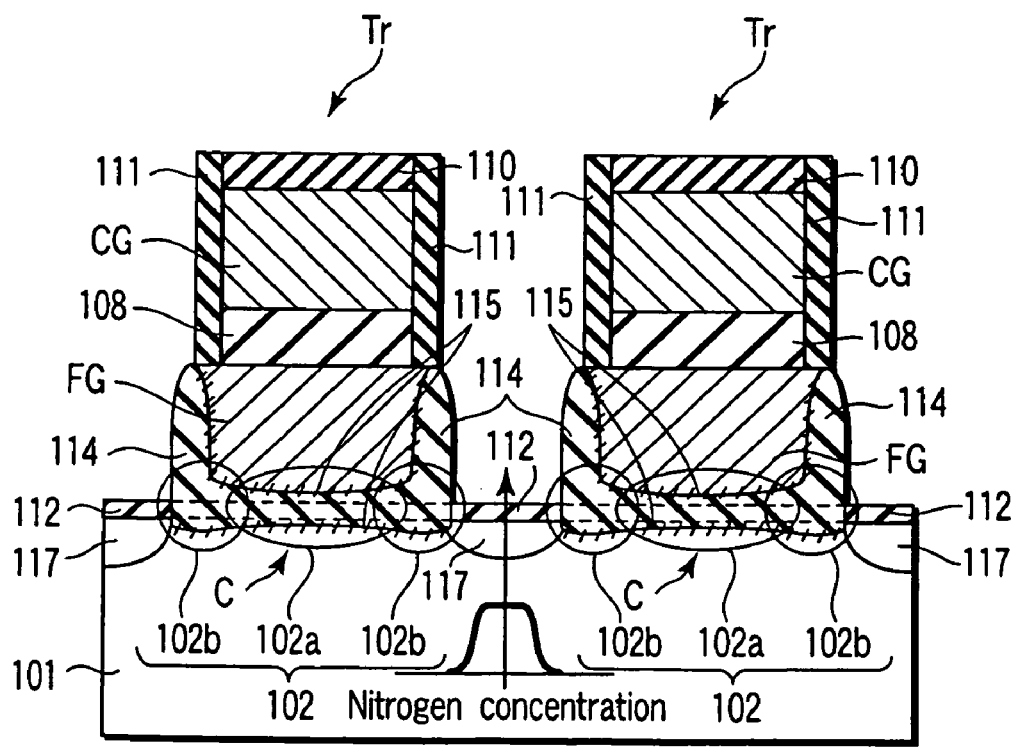
FIG. 23 is a view showing the nitrogen concentration distribution in a silicon oxynitride layer according to the second embodiment of the present invention.

FIG. 23 shows the nitrogen concentration distribution in the silicon oxynitride layer according to the second embodiment of the present invention. This nitrogen concentration distribution in the silicon oxynitride layer according to the second embodiment will be explained below.

As shown in FIG. 23, the nitrogen concentration in the silicon oxynitride layer 112 gradually increases from its end portions to its central portion. Accordingly, in the silicon oxynitride layer 112, the nitrogen concentration is lowest in its end portions and highest in its central portion.

In the second embodiment described above, substantially the same effects as in the first embodiment can be obtained as follows.

The position B of the upper surface of the source/drain diffusion layers 117 is lower than the position A of the bottom surface of the floating gate electrode FG, and the positions Ca and Cb of the upper surface of the channel region C are lower than the position B of the upper surface of the source/drain diffusion layers 117 (FIG. 14). That is, the position of the upper surface of the channel region C can be made lower than that in the conventional devices. In particular, depletion layers of the source/drain diffusion layers 117 can be separated between the source and drain by the end portions 102b of the tunnel oxide film 102. It is also possible to effectively substantially increase the channel length (source-to-drain distance). Therefore, in the nonvolatile memory cell transistor Tr generally having a low channel impurity concentration, punch through can be suppressed even when the channel length increases. This makes it possible to suppress the short-channel effect, and greatly downsize the memory cell transistor Tr.

In addition, the film thickness of the central portion 102a of the tunnel oxide film 102 is smaller than that of the end portions 102b. This increases the gate potential's control over the channel potential, so the short-channel effect can be suppressed more effectively.

Furthermore, the film thickness of the end portions 102b of the tunnel oxide film 102 positioned in the end portions of the floating gate electrode FG is large. This makes it possible to reduce the parasitic capacitance between the floating gate electrode FG and source/drain diffusion layers 117, so the decrease in operating speed of the memory cell transistor Tr can be further suppressed. Also, since the electric fields between the end portions of the floating gate electrode FG and the source/drain diffusion layers 117 can be reduced, the reliability of the memory cell transistor Tr whose reliability is regarded as important can be greatly improved.

Since the film thickness of the end portions 102b of the tunnel oxide film 102 is large, the distance between the floating gate electrode FG and the source/drain diffusion layer 117 can be increased. In this case, compared to the conventional elevated source/drain structure, the overlap capacitance C between the floating gate electrode FG and source/drain diffusion layer 117 can be reduced. This eliminates the problem of the decrease in operating speed of the transistor Tr.

The gate length (channel length) L2 of the floating gate electrode FG is approximately 50 nm or less. With this prescribed value, the bird's beak oxidation reaction progresses to the central portion 102a (channel central portion) of the tunnel oxide film 102, thereby realizing a preferable transistor structure. In addition, during gate sidewall oxynitriding, the bird's beak nitriding reaction of the tunnel oxide film 102 advances to realize a high-quality film.

Also, the interface nitride layers 115 are formed in the interface between the floating gate electrode FG and tunnel oxide film 102, in the interface between the floating gate electrode FG and gate sidewall oxide film 114, and in the interface between the tunnel oxide film 102 and silicon substrate 101. Therefore, it is possible to prevent mixing of an impurity from the floating gate electrode FG or silicon substrate 101 to the tunnel oxide film 102. As a consequence, a low-electric-field leakage current of the tunnel oxide film 102 can be suppressed. Therefore, the charge retention characteristics can be improved.

Furthermore, the sidewall portions of the inter-electrode insulating film 108 do not undergo bird's beak oxidation because they are covered with the sidewall cover film 118. This make it possible to implement a cell transistor Tr having a high cell coupling ratio, and suppress variations in cell characteristics.

Figure 24A:
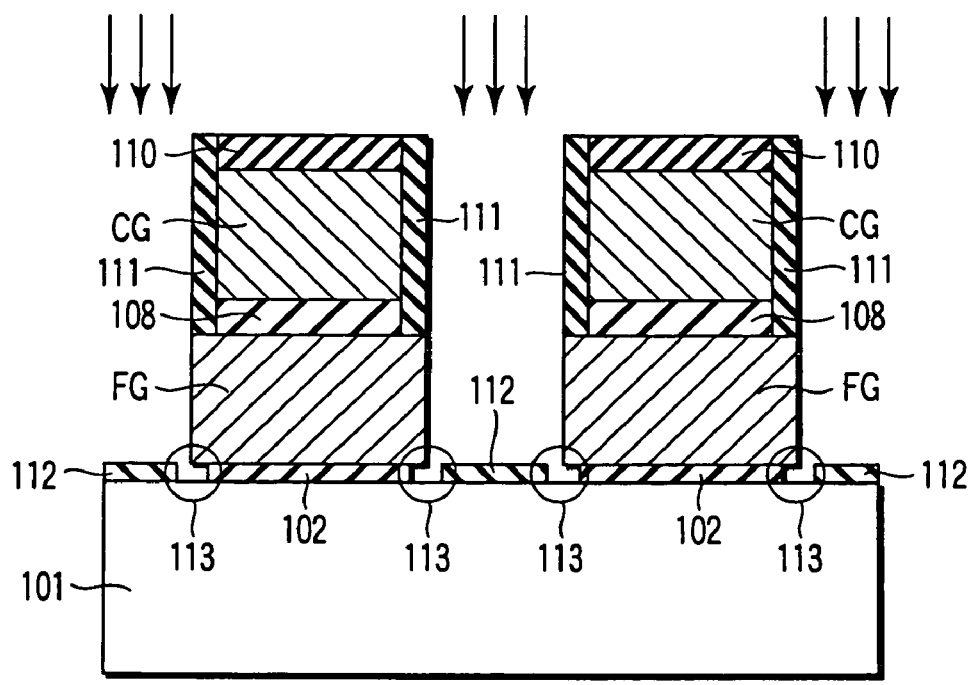
FIGS. 24A and 24B are sectional views showing the fabrication steps of another nonvolatile semiconductor memory according to the second embodiment of the present invention, in which after silicon oxynitride layers are formed, a tunnel oxide film in gaps is removed.
Figure 24B:
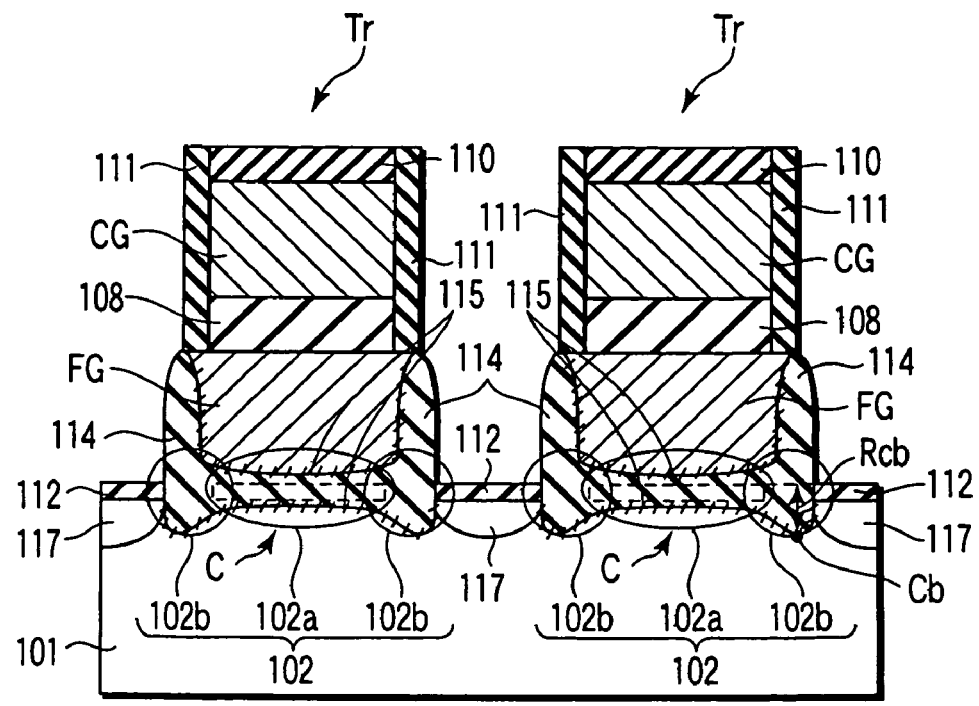

Note that in the second embodiment, after the silicon oxynitride layers 112 are formed (FIG. 21), it is also possible to remove the tunnel oxide film 102 in the gaps 113 or in low-nitrogen-concentration regions by, e.g., a dilute hydrofluoric acid solution (FIG. 24A), and then form a gate sidewall oxide film 114 by thermal oxidation. In this case, as shown in FIG. 24B, oxidation readily progresses near the gaps 113, so the film thickness of the end portions 102b of the tunnel oxide film 102 can be further increased. Accordingly, the position Cb of the upper surface of the end portion of the channel region C lowers, so the recession amount Rcb can be further increased. This makes it possible to suppress the short-channel effect more effectively.

Figure 25A:
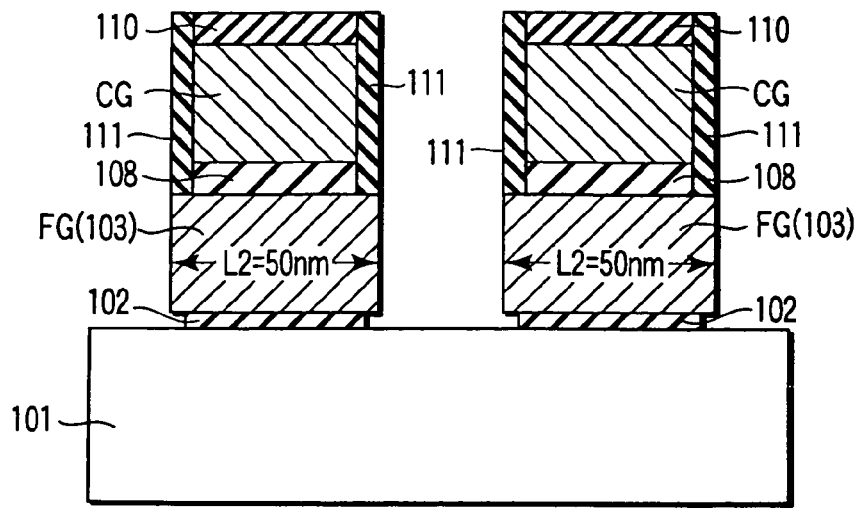
FIGS. 25A and 25B are sectional views showing the fabrication steps of still another nonvolatile semiconductor memory according to the second embodiment of the present invention, in which after floating gate electrodes are formed, a tunnel oxide film exposed from the floating gate electrodes is removed.
Figure 25B:
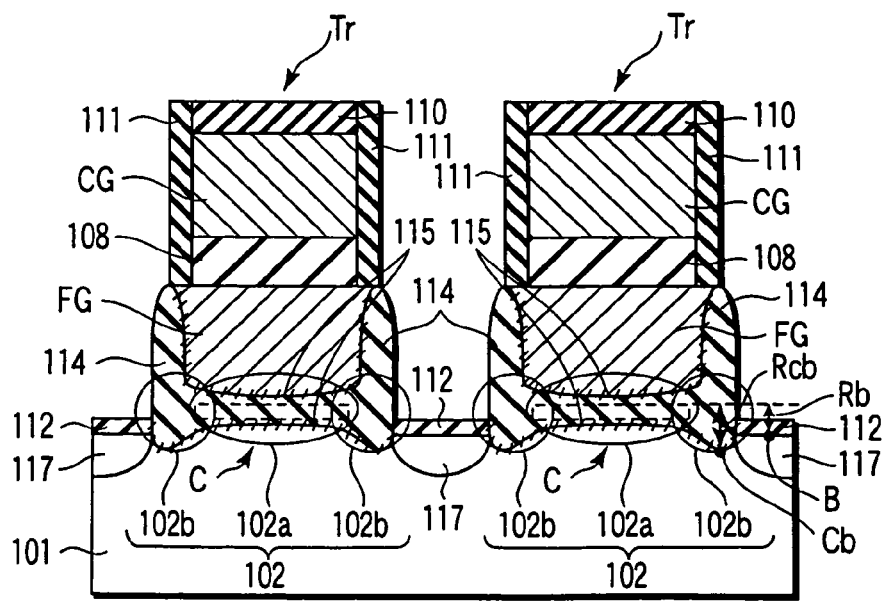
Figure 26:
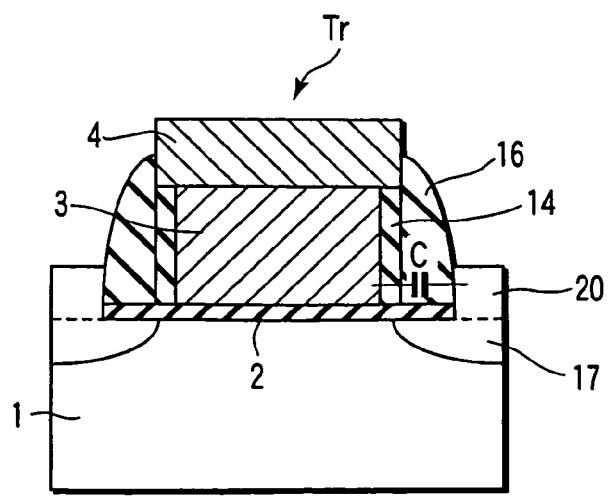
FIG. 26 is a schematic view showing a semiconductor device having an elevated source/drain structure according to prior art.

Likewise, after the floating gate electrodes FG are formed (FIG. 20), it is also possible to remove the tunnel oxide film 102 exposed from the floating gate electrodes FG by, e.g., a dilute hydrofluoric acid solution (FIG. 25A), and then form silicon oxynitride layers 112. In this structure as shown in FIG. 25B, compared to the structure shown in FIG. 13, the position B of the upper surfaces of the source/drain layers 117 decreases, and the recession amount Rb increases, but the position Cb of the upper surfaces of the end portions of the cannel region C also decreases, and the recession amount Rcb also increases. Therefore, the short-channel effect can be suppressed as in the structure shown in FIG. 13. In addition, it is possible to form the silicon oxynitride layers 112 having an oxidation preventing power higher than that of the structure shown in FIG. 13.

The present invention is not limited to the above embodiments, but can be variously modified, when practiced, without departing from the spirit and scope of the invention. For example, an SOI (Silicon On Insulator) substrate may also be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising:
forming a gate insulating film on a semiconductor substrate;
selectively forming a gate electrode on the gate insulating film;
forming a nitrogen-containing insulating film by nitriding an exposed portion of the gate insulating film;
performing thermal oxidation that an oxide amount at an upper surface of the semiconductor substrate and at a bottom surface of the gate electrode reduces from an end portion to a central portion of a channel region beneath the gate electrode, forming a sidewall layer on a side surface of the gate electrode, and thickening the gate insulating film in a lower end portion of the gate electrode; and
forming a source/drain diffusion layer in the semiconductor substrate.

2. The method according to claim 1, wherein an upper surface of the source/drain diffusion layer is positioned below a bottom surface of the gate electrode, and a bottom surface of the gate insulating film in a central portion of the gate insulating film is positioned below the upper surface of the source/drain diffusion layer.

3. The method according to claim 1, wherein the nitrogen-containing insulating film is formed that a nitrogen concentration in a first end portion of the nitrogen containing insulating film, which is adjacent to the gate electrode is lower than a nitrogen concentration in a second end portion of the nitrogen containing insulating film, which is opposite to the first end portion of the nitrogen-containing insulating film.

4. The method according to claim 1, further comprising forming a gap between the nitrogen containing insulating film and an end portion of the gate electrode.

5. The method according to claim 1, further comprising forming an interface nitride layer in a first interface between the gate electrode and gate insulating film, and in a second interface between the gate insulating film and semiconductor substrate.

6. The method according to claim 1, wherein the thermal oxidation increases a film thickness of the gate insulating film from a center of the channel region toward the source/drain diffusion layer.

7. The method according to claim 1, wherein a film thickness of the sidewall layer decreases from the bottom surface to an upper surface of the gate electrode.

8. The method according to claim 1, further comprising removing the gate insulating film below an end portion of the gate electrode, after the nitrogen-containing insulating film is formed and before the thermal oxidation is performed.

9. The method according to claim 1, in which the gate electrode is a floating gate electrode of a nonvolatile memory cell transistor, and the gate insulating film is a tunnel insulating film, and which further comprises:

forming an inter-electrode insulating film on the gate electrode; and forming a control gate electrode on the inter-electrode insulating film.

10. The method according to claim 9, wherein an upper surface of the source/drain diffusion layer is positioned below a bottom surface of the gate electrode, and a bottom surface of the gate insulating film in a central portion of the gate insulating film is positioned below the upper surface of the source/drain diffusion layer.

* * * * *